US006941124B1

United States Patent
O'Toole et al.

(10) Patent No.: US 6,941,124 B1
(45) Date of Patent: Sep. 6, 2005

(54) METHOD OF SPEEDING POWER-UP OF AN AMPLIFIER, AND AMPLIFIER

(75) Inventors: James E. O'Toole, Boise, ID (US); John R. Tuttle, Boise, ID (US); Mark E. Tuttle, Boise, ID (US); Tyler Lowrey, Boise, ID (US); Kevin M. Devereaux, Boise, ID (US); George E. Pax, Boise, ID (US); Brian P. Higgins, Boise, ID (US); David K. Ovard, Meridian, ID (US); Shu-Sun Yu, Boise, ID (US); Robert R. Rotzoll, Colorado Springs, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/502,693

(22) Filed: Feb. 11, 2000

Related U.S. Application Data

(60) Continuation of application No. 09/152,662, filed on Sep. 14, 1998, now Pat. No. 6,249,185, which is a division of application No. 08/705,043, filed on Aug. 29, 1996, now Pat. No. 6,130,602.
(60) Provisional application No. 60/017,900, filed on May 13, 1996.

(51) Int. Cl.[7] .............................................. H04B 1/16
(52) U.S. Cl. ..................... 455/341; 455/231; 330/261
(58) Field of Search ................................. 455/341, 342, 455/194.2, 231, 253.2, 241.1, 291, 293, 311, 312, 333; 330/64, 252–253, 261, 302–303, 9, 141, 281; 327/555, 557, 563; 342/28

(56) References Cited

U.S. PATENT DOCUMENTS 3,299,424 A   1/1967  Vinding
3,694,776 A   9/1972  Linder ........................... 333/17
3,852,755 A  12/1974  Works et al.

(Continued)

FOREIGN PATENT DOCUMENTS

| EP | 0 172 445 A1 | 7/1985 |
|---|---|---|
| EP | 0 682 382 A2 | 4/1995 |
| EP | 0 682 382 A3 | 5/1995 |

(Continued)

OTHER PUBLICATIONS

N.J. Woods et al., "One micrometre scale slef–aligned cobalt disilicide Schenky barrier diodes", Electronics Letters. IEE Stevenage. GB. vol. 31, No. 21, Oct. 1995. pp. 1878–1880.

(Continued)

*Primary Examiner*—Nick Corsaro
*Assistant Examiner*—Philip J. Sobutka
(74) *Attorney, Agent, or Firm*—Wells St. John P.S.

(57) ABSTRACT

An amplifier powered by a selectively engageable voltage source and a method for operating the amplifier. The amplifier includes first and second electrodes for receiving an input signal to be amplified. The first and second electrodes are adapted to be respectively connected to coupling capacitors. The amplifier also includes a differential amplifier having inputs respectively connected to the first and second electrodes, and having an output. The amplifier additionally includes selectively engageable resistances coupled between the voltage source and respective inputs of the differential amplifier and defining, with the coupling capacitors, the high pass characteristics of the circuit. The amplifier further includes second selectively engageable resistances coupled between the voltage source and respective inputs of the differential amplifier. The second resistances respectively have smaller values than the first mentioned resistances, and are engaged and then disengaged in response to the voltage source being engaged.

35 Claims, 1 Drawing Sheet

U.S. PATENT DOCUMENTS

| | | |
|---|---|---|
| 3,921,094 A | 11/1975 | Schaible .................... 331/1 |
| 3,924,320 A | 12/1975 | Altman et al. |
| 4,075,632 A | 2/1978 | Baldwin et al. |
| 4,190,838 A | 2/1980 | Kemp .................... 343/18 |
| 4,384,288 A | 5/1983 | Walton .................... 340/825.34 |
| 4,478,881 A | 10/1984 | Bartur et al. .................... 427/90 |
| 4,514,731 A | 4/1985 | Falck et al. .................... 340/825.08 |
| 4,572,976 A | 2/1986 | Fockens |
| 4,656,463 A | 4/1987 | Anders et al. |
| 4,697,184 A * | 9/1987 | Cheal et al. .................... 342/28 |
| 4,700,179 A | 10/1987 | Fancher |
| 4,724,427 A | 2/1988 | Carroll |
| 4,743,864 A | 5/1988 | Nakagawa et al. |
| 4,746,830 A | 5/1988 | Holland |
| 4,783,646 A | 11/1988 | Matsuzaki .................... 340/572 |
| 4,786,903 A | 11/1988 | Grindahl et al. |
| 4,800,543 A | 1/1989 | Lyndon-James et al. |
| 4,816,839 A | 3/1989 | Landt |
| 4,827,395 A | 5/1989 | Anders et al. |
| 4,843,354 A | 6/1989 | Fuller et al. .................... 333/81 |
| 4,853,705 A | 8/1989 | Landt |
| 4,854,328 A | 8/1989 | Pollack |
| 4,857,893 A | 8/1989 | Carroll |
| 4,862,160 A | 8/1989 | Ekchian et al. |
| 4,868,908 A | 9/1989 | Pless et al. .................... 323/267 |
| 4,870,419 A | 9/1989 | Baldwin et al. |
| 4,888,591 A | 12/1989 | Landt et al. |
| 4,890,072 A | 12/1989 | Espe et al. |
| 4,897,662 A | 1/1990 | Lee et al. .................... 343/701 |
| 4,912,471 A | 3/1990 | Tyburski et al. |
| 4,926,182 A | 5/1990 | Ohta et al. |
| 4,942,393 A | 7/1990 | Waraksa et al. .................... 340/825.72 |
| 4,952,889 A | 8/1990 | Irwin et al. |
| 5,030,807 A | 7/1991 | Landt et al. |
| 5,072,194 A | 12/1991 | Chevallier .................... 330/260 |
| 5,075,691 A | 12/1991 | Garay et al. |
| 5,081,458 A | 1/1992 | Meunier |
| 5,086,389 A | 2/1992 | Hassett et al. |
| 5,103,156 A | 4/1992 | Jones et al. .................... 320/35 |
| 5,121,407 A | 6/1992 | Partyka et al. .................... 375/1 |
| 5,122,687 A | 6/1992 | Schmidt |
| 5,128,938 A | 7/1992 | Borras |
| 5,130,668 A | 7/1992 | Emslie et al. |
| 5,134,085 A | 7/1992 | Gilgen et al. |
| 5,142,292 A | 8/1992 | Chang |
| 5,143,820 A | 9/1992 | Kotecha et al. .................... 430/314 |
| 5,144,314 A | 9/1992 | Malmberg et al. |
| 5,151,624 A | 9/1992 | Stegherr et al. |
| 5,153,583 A | 10/1992 | Murdoch |
| 5,164,985 A | 11/1992 | Nysen et al. |
| 5,175,774 A | 12/1992 | Truax et al. |
| 5,191,295 A | 3/1993 | Necoechea .................... 328/155 |
| 5,206,609 A | 4/1993 | Mijuskovic |
| 5,218,343 A | 6/1993 | Stobbe et al. |
| 5,231,273 A | 7/1993 | Caswell |
| 5,235,326 A | 8/1993 | Beigel et al. .................... 340/825.54 |
| 5,252,979 A | 10/1993 | Nysen |
| 5,272,367 A | 12/1993 | Dennison et al. |
| 5,281,927 A | 1/1994 | Parker .................... 331/1 A |
| 5,287,112 A | 2/1994 | Schuermann |
| 5,294,928 A | 3/1994 | Cooper et al. |
| 5,300,875 A | 4/1994 | Tuttle |
| 5,300,896 A | 4/1994 | Suesserman .................... 330/260 |
| 5,311,186 A | 5/1994 | Utsu et al. |
| 5,317,309 A | 5/1994 | Vercellotti et al. .................... 340/825.54 |
| 5,323,150 A | 6/1994 | Tuttle |
| 5,334,951 A | 8/1994 | Hogeboom .................... 331/1 |
| 5,340,968 A | 8/1994 | Watanabe et al. |
| 5,355,513 A | 10/1994 | Clarke et al. |
| 5,361,403 A | 11/1994 | Dent .................... 455/74 |
| 5,365,192 A | 11/1994 | Wagner et al. .................... 330/252 |
| 5,365,551 A | 11/1994 | Snodgrass et al. |
| 5,374,930 A | 12/1994 | Schuermann |
| 5,394,159 A | 2/1995 | Schneider et al. .................... 343/700 |
| 5,394,444 A | 2/1995 | Silvey et al. |
| 5,406,263 A | 4/1995 | Tuttle |
| 5,406,297 A | 4/1995 | Caswell et al. .................... 343/741 |
| 5,412,351 A | 5/1995 | Nystrom et al. |
| 5,412,665 A | 5/1995 | Gruodis et al. |
| 5,416,434 A | 5/1995 | Kootstra et al. |
| 5,420,757 A | 5/1995 | Eberhardt et al. |
| 5,423,074 A | 6/1995 | Dent .................... 544/74 |
| 5,430,441 A | 7/1995 | Bickley et al. |
| 5,444,223 A | 8/1995 | Blama |
| 5,446,761 A | 8/1995 | Nag et al. |
| 5,446,765 A | 8/1995 | Leger .................... 375/359 |
| 5,448,110 A | 9/1995 | Tuttle et al. |
| 5,448,242 A | 9/1995 | Sharpe et al. |
| 5,448,770 A | 9/1995 | Hietala et al. .................... 455/125 |
| 5,448,772 A | 9/1995 | Grandfield |
| 5,450,087 A | 9/1995 | Hurta et al. |
| 5,461,385 A | 10/1995 | Armstrong |
| 5,471,212 A | 11/1995 | Sharpe et al. |
| 5,478,991 A | 12/1995 | Watanabe et al. |
| 5,485,520 A | 1/1996 | Chaum et al. .................... 380/24 |
| 5,489,546 A | 2/1996 | Ahmad et al. |
| 5,491,718 A | 2/1996 | Gould et al. .................... 375/205 |
| 5,499,214 A | 3/1996 | Mori et al. |
| 5,500,650 A | 3/1996 | Snodgrass et al. |
| 5,511,090 A | 4/1996 | Denton et al. .................... 375/205 |
| 5,519,386 A | 5/1996 | Tobergte .................... 340/825.54 |
| 5,525,992 A | 6/1996 | Froschermeier |
| 5,541,583 A | 7/1996 | Mandelbaum |
| 5,541,585 A | 7/1996 | Duhame et al. |
| 5,568,512 A | 10/1996 | Rotzoll |
| 5,576,647 A | 11/1996 | Sutardja et al. .................... 327/108 |
| 5,606,322 A | 2/1997 | Allen et al. .................... 341/173 |
| 5,606,323 A | 2/1997 | Heinrich et al. |
| 5,621,412 A | 4/1997 | Sharpe et al. |
| 5,623,224 A | 4/1997 | Yamada et al. |
| 5,640,151 A | 6/1997 | Reis et al. .................... 340/825.54 |
| 5,649,295 A | 7/1997 | Shober et al. .................... 455/38.2 |
| 5,649,296 A | 7/1997 | MacLellan et al. |
| 5,657,359 A | 8/1997 | Sakae et al. |
| 5,668,560 A | 9/1997 | Evans et al. .................... 343/702 |
| 5,677,667 A | 10/1997 | Lesesky et al. |
| 5,686,864 A | 11/1997 | Martin et al. |
| 5,686,920 A | 11/1997 | Hurta et al. |
| 5,696,025 A | 12/1997 | Violette et al. .................... 437/175 |
| 5,703,509 A | 12/1997 | Hirata |
| 5,705,947 A | 1/1998 | Jeong .................... 327/270 |
| 5,719,550 A | 2/1998 | Bloch et al. |
| 5,721,678 A | 2/1998 | Widl |
| 5,721,783 A | 2/1998 | Anderson |
| 5,726,630 A | 3/1998 | Marsh et al. |
| 5,741,462 A | 4/1998 | Nova et al. .................... 422/68.1 |
| 5,774,022 A | 6/1998 | Griffin et al. .................... 331/1 A |
| 5,780,916 A | 7/1998 | Berger et al. |
| 5,815,042 A | 9/1998 | Chow et al. |
| 5,901,349 A | 5/1999 | Guegnaud et al. |
| 5,907,789 A | 5/1999 | Komatsu |
| 5,940,006 A | 8/1999 | MacLellan et al. .... 340/825.54 |
| 5,970,398 A | 10/1999 | Tuttle .................... 455/193.1 |
| 6,122,494 A | 9/2000 | Tuttle .................... 455/193.1 |
| 6,249,185 B1 * | 6/2001 | O'Toole et al. .................... 330/261 |
| 6,249,212 B1 | 6/2001 | Beigel et al. .................... 340/10.34 |

OTHER PUBLICATIONS

Shenai Krishna, "Characteristics of LPCVD W512/N–51 Schonky Contacts", IEEE Electron Device Letters, US. IEEE Inc. N.Y., vol. 12 No. 4, Apr. 1991, pp. 169–171.

"Micron Morning Report", The Idaho Statesman, Jul. 16, 1993.

"A Low–Power Spread Spectrum CMOS RFIC for Radio Identification Applications", by John R. Tuttle, Conference Proceedings from RF Expo West, pp. 216–222, Mar. 22–24, 1994, San Jose, CA.

U.S. Appl. No. 60/023,321, filed Jul. 30, 1996.

"CMOS Analog Integrated Circuits Based on Weak Inversion Operation", by Eric Vittoz and Jean Fellrath, IEEE Journal of Solid State Circuits, vol. SC–12, No. 3, Jun. 1977.

Mitsubishi Motor Corporation Web Page, 1995.

"Digital RF/ID Enhances GPS", by John R. Tuttle, Proceedings of the Second Annual Wireless Symposium, pp. 406–411, Feb. 15–18, 1994, Santa Clara, CA.

U.S. Appl. No. 60/023,318, filed Jul. 30, 1996.

"Micron RFID Communications Protocol Manual," Jul. 22, 1993, Pre–Release Version 0.95, pp. 1–71.

*Analysis and Design of Analog Integrated Circuits,* Paul R. Gray & Robert G. Meyer, pp. 667–681; 1993.

*Analog Integrated Circuits for Communication (Principles, Simulation and Design)*, Donald O. Pederson & Kartikeya Mayaram, pp. 431–433, 1991.

*A Precise Four–Quadrans Multiplier With Subnanosecond Response,* B. Gilbert, IEEE Journal of Solid State Circuits, pp. 365–373, 1968.

Raymond W. Waugh, "Designing Detectors for RF/ID Tags," Proceedings of RF Expo West, 1995 13 pages.

Buechler, J., et al., "Silicon Millimeter–Wave Circuits for Receivers and Transmitters", *IEEE Microwave and Millmeter–Wave Monolithic Circuits Symposium* , pp. 67–70 (1988).

Wolf Ph.D., Stanley, *Silicon Processing for the VLSI Era,* vol. 2: Process Integration , Lattice Press, pp. 65 & 195 (1990).

Fink & Christiansen, Electronic Engineer's Handbook, 3rd Edition, McGraw–Hill, 1989, pp. 8–22, 8–23 and 8–40.

Wolf, Silicon Processing for the VLSI Era vol. 2: Process Integration, 1986 Lattice Press, pp. 65 and 195.

E.C. Young, "The Penguin Dictionary of Electronics", 1988, Market House Books, pp. 7 and 124.

* cited by examiner

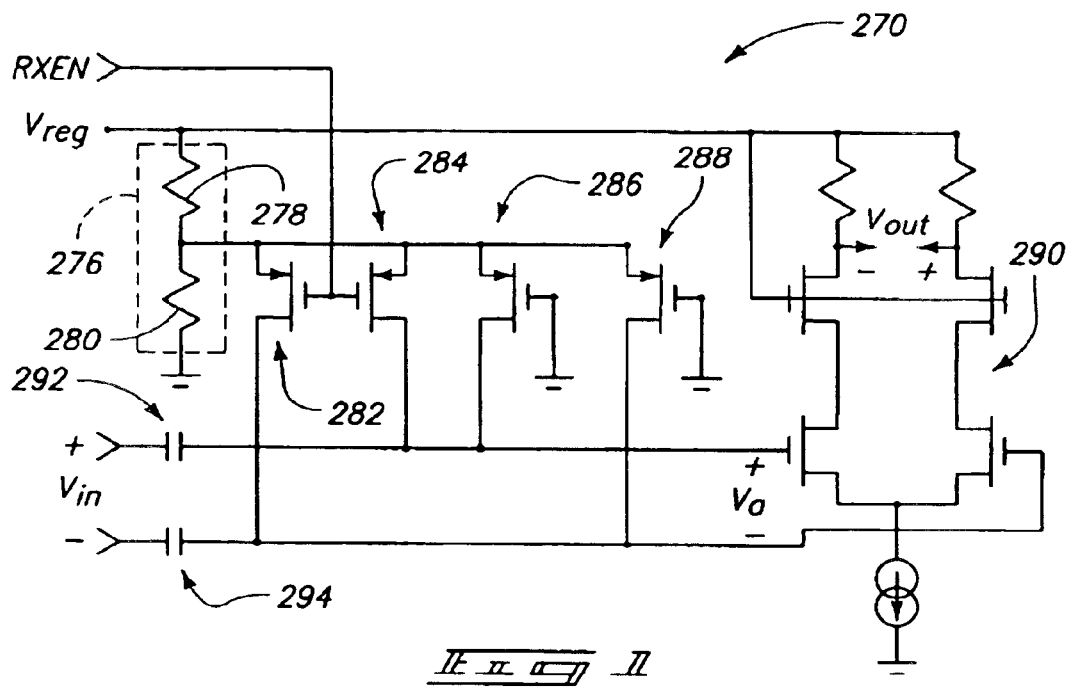
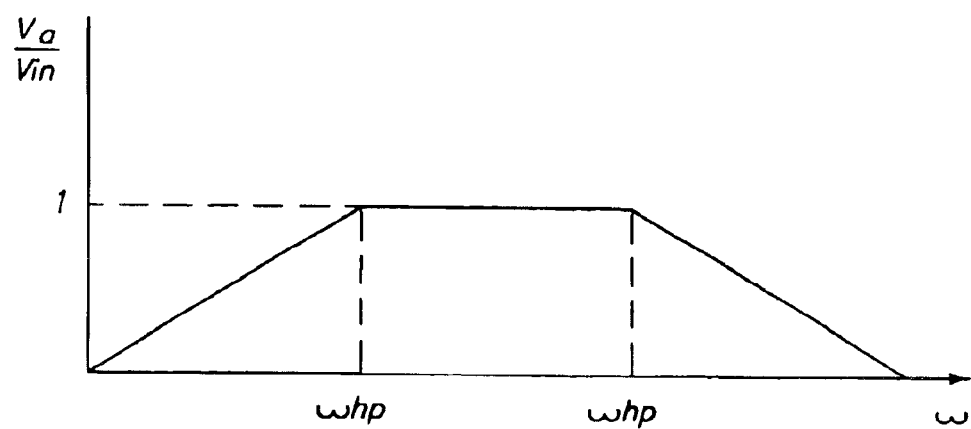

METHOD OF SPEEDING POWER-UP OF AN AMPLIFIER, AND AMPLIFIER

CROSS REFERENCE TO RELATED APPLICATION

This is a Continuation of U.S. patent application Ser. No. 09/152,662, filed Sept. 14, 1998, and titled "Radio Frequency Data Communications Device", now U.S. Pat. No. 6,249,185 (incorporated herein by reference), which in turn is a Division of U.S. patent application Ser. No. 08/705,043, filed Aug. 29, 1996, now U.S. Pat. No. 6,130,602 (incorporated herein by reference), which in turn claims priority from U.S. Provisional application Ser. No. 60/017,900, filed May 13, 1996.

COPYRIGHT AUTHORIZATION

A portion of the disclosure of this patent document, including the appended microfiche, contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

REFERENCE TO MICROFICHE

Appended hereto is a microfiche copy of a software guide entitled "Micron RFID Systems Developer's Guide," May 2, 1996. This appendix has 5 microfiche providing 266 total frames.

TECHNICAL FIELD

This invention relates to radio frequency communication devices. More particularly, the invention relates to radio frequency identification devices for inventory control, object monitoring, or for determining the existence, location or movement of objects.

BACKGROUND OF THE INVENTION

As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. Furthermore, there is a need for tag devices suitably configured to mount to a variety of objects including goods, items, persons, or animals, or substantially any moving or stationary and animate or inanimate object. One way of tracking objects is with an electronic identification system.

One presently available electronic identification system utilizes a magnetic field modulation system to monitor tag devices. An interrogator creates a magnetic field that becomes detuned when the tag device is passed through the magnetic field. In some cases, the tag device may be provided with a unique identification code in order to distinguish between a number of different tags. Typically, the tag devices are entirely passive (have no power supply), which results in a small and portable package. However, this identification system is only capable of distinguishing a limited number of tag devices, over a relatively short range, limited by the size of a magnetic field used to supply power to the tags and to communicate with the tags.

Another electronic identification system utilizes an RF transponder device affixed to an object to be monitored, in which an interrogator transmits an interrogation signal to the device. The device receives the signal, then generates and transmits a responsive signal. The interrogation signal and the responsive signal are typically radio-frequency (RF) signals produced by an RF transmitter circuit. Since RF signals can be transmitted over greater distances than magnetic fields, RF-based transponder devices tend to be more suitable for applications requiring tracking of a tagged device that may not be in close proximity to an interrogator. For example, RF-based transponder devices tend to be more suitable for inventory control or tracking.

BRIEF DESCRIPTION OF THE DRAWINGS

Preferred embodiments of the invention are described below with reference to the following accompanying drawings.

FIG. 1 is a simplified circuit schematic of a quick bias AC-coupled video amplifier included in the integrated circuit.

FIG. 2 is a plot of voltage versus angular frequency illustrating selection of components to realize a desired high pass roll off frequency in the amplifier of FIG. 1.

FIG. 1 provides a simplified circuit schematic of a quick bias AC-coupled video amplifier 270. The video amplifier goes from a power down (unbiased) state to a fully biased state quickly despite a large value effective resistance and capacitor used to bias and couple the amplifier.

This video amplifier has an input adapted to be connected to $V_{in}$ and includes coupling capacitors 292 and 294 at the input.

The video amplifier includes a voltage divider 276 including two resistors 278 and 280 in series, and four transistors 282, 284, 286, and 288 shown to the right of a voltage divider in FIG. 1. Transistors 286 and 288, the rightmost two of the four transistors, are long L (length), narrow W (width) p-channel devices operated in linear mode to provide very high effective resistance $R_{EFF}$. Transistors 286 and 288 are used instead of resistors because it is hard to provide high resistances using resistors without generating undesirable parasitic capacitance and without taking up more space on an integrated circuit die. The video amplifier 270 includes a differential amplifier 290. The voltage divider 276 sets a bias voltage at the inputs of the differential amplifier 290. The effective resistance $R_{EFF}$, in conjunction with the value of coupling capacitor 292 or 294, sets the angular high pass roll off frequency for the amplifier according to a relationship of $\omega_{HP}=1/((R_{EFF}+R1\|R2)C1)$ where $\omega$ is angular frequency ($2\pi$ times frequency), R1 and R2 are the values of the resistors 278 and 280 included in the voltage divider 276, and C1 is the value of one of the coupling capacitors. The values of $R_{EFF}$, and the coupling capacitors are adjusted to achieve the desired high pass roll off frequency $\omega_{HP}$ as illustrated in FIG. 2. The high pass roll off frequency determines what frequencies will be amplified or attenuated. The high pass roll off frequency is set low enough so that important data is not excluded.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An amplifier configured to be powered by a selectively engageable voltage source, the amplifier comprising:
a differential amplifier having first and second inputs for receiving an input signal to be amplified, and having an output;
first resistances between the voltage source and respective inputs of the differential amplifier; and
second, selectively engageable, resistances between the voltage source and respective inputs of the differential amplifier, the second resistances respectively having smaller resistance values than the first resistances, the second resistances being engaged then disengaged in response to the voltage source being engaged.

2. An amplifier in accordance with claim 1 and further comprising coupling capacitors respectively coupled to the first and second inputs.

3. An amplifier in accordance with claim 1 and further comprising a voltage divider, and wherein the first and second resistances are coupled to the voltage source via the voltage divider.

4. An amplifier in accordance with claim 1 wherein the first resistances comprise respective transistors.

5. An amplifier in accordance with claim 1 wherein the first resistances comprise respective p-type transistors.

6. An amplifier in accordance with claim 1 wherein the second resistances comprise respective transistors.

7. An amplifier in accordance with claim 1 wherein the second resistances comprise respective p-type transistors.

8. A method of speeding power up of an amplifier stage configured to be powered by a voltage source and including a differential amplifier having first and second inputs configured to receive an input signal to be amplified, and having an output; and resistances between the voltage source and respective inputs of the differential amplifier, the method comprising:
shorting around the selectively resistances for an amount of time in response to the voltage source being engaged.

9. A method in accordance with claim 8 wherein the shorting comprises engaging selectively engageable second resistances respectively coupled in parallel with the first mentioned resistances and having respective resistance values lower than the first mentioned resistances.

10. A method of speeding power up of an amplifier stage configured to be powered by a voltage source and including first and second electrodes configured to receive an input signal to be amplified, the input electrodes being adapted to be respectively coupled to coupling capacitors; a differential amplifier having inputs respectively connected to the first and second electrodes, and having an output; and resistances between the voltage source and respective inputs of the differential amplifier, the method comprising:
shorting around the resistances for a predetermined amount of time in response to the voltage source being engaged, the shorting comprising engaging selectively engageable second resistances respectively coupled in parallel with the first mentioned resistances and having respective resistance values lower than the first mentioned resistances.

11. A receiver comprising:
a Schottky diode detector;
an amplifier coupled to the Schottky diode detector and configured to be powered by a selectively engageable voltage source, the amplifier including:
a differential amplifier having first and second inputs coupled to the Schottky diode detector to amplify a signal generated by the Schottky diode detector, and having an output;
first resistances between the voltage source and respective inputs of the differential amplifier; and
second, selectively engageable, resistances between the voltage source and respective inputs of the differential amplifier, the second resistances respectively having smaller resistance values than the first resistances, the second resistances being engaged then disengaged in response to the voltage source being engaged.

12. A receiver in accordance with claim 11 and further comprising coupling capacitors respectively coupled between the Schottky diode detector and the first and second inputs of the differential amplifier.

13. A receiver in accordance with claim 11 wherein the amplifier further comprises a voltage divider, and wherein the first mentioned and second resistances are coupled to the voltage source via the voltage divider.

14. A receiver in accordance with claim 11 wherein the first mentioned resistances of the amplifier comprise respective transistors.

15. A receiver in accordance with claim 11 wherein the first mentioned resistances of the amplifier comprise respective p-type transistors.

16. A receiver in accordance with claim 11 wherein the second resistances of the amplifier comprise respective transistors.

17. A receiver in accordance with claim 11 wherein the second resistances comprise respective p-type transistors.

18. A method of speeding power-up of an amplifier stage of a receiver having a Schottky diode detector, the amplifier stage being configured to be powered by a voltage source and including a differential amplifier having first and second inputs configured to receive an input signal to be amplified from the Schottky diode detector, and having an output; and selectively resistances between the voltage source and respective inputs of the differential amplifier, the method comprising:
shorting around the resistances for an amount of time in response to the voltage source being engaged.

19. A method in accordance with claim 18 wherein the shorting comprises engaging selectively engageable second resistances respectively coupled in parallel with the first mentioned resistances and having respective resistance values lower than the first mentioned resistances.

20. A method of speeding power up of an amplifier stage of a receiver having a Schottky diode detector, the amplifier stage being configured to be powered by a voltage source and including first and second electrodes configured to receive an input signal to be amplified, the input electrodes being adapted to be respectively coupled to the Schottky diode detector by coupling capacitors to amplify a signal generated by the Schottky diode detector; the amplifier stage further including a differential amplifier having inputs respectively connected to the first and second electrodes, and having an output; and selectively engageable resistances between the voltage source and respective inputs of the differential amplifier, the method comprising:
shorting around the selectively engageable resistances for a predetermined amount of time in response to the voltage source being engaged, the shorting comprising engaging selectively engageable second resistances respectively coupled in parallel with the first mentioned resistances and having respective resistance values lower than the first mentioned resistances.

21. A receiver comprising:

an RF detector;

an amplifier coupled to the RF detector and configured to be powered by a selectively engageable voltage source, the amplifier including:

a differential amplifier having first and second inputs coupled to the Schottky diode detector to amplify a signal generated by the Schottky diode detector, and having an output;

first resistances between the voltage source and respective inputs of the differential amplifier; and second, selectively engageable, resistances between the voltage source and respective inputs of the differential amplifier, the second resistances respectively having smaller resistance values than the first resistances, the second resistances being engaged then disengaged in response to the voltage source being engaged.

22. A receiver in accordance with claim 21 wherein the RF detector comprises a Schottky diode detector.

23. A receiver in accordance with claim 21 wherein the second resistances comprise transistors.

24. An amplifier configured to be powered by a selectively engageable voltage source, the amplifier comprising:

a differential amplifier having first and second inputs for receiving an input signal to be amplified, and having an output;

a first resistance between the voltage source and the first input of the differential amplifier;

a second resistance between the voltage source and the second input of the differential amplifier;

a third, selectively engageable, resistance between the voltage source and the first input of the differential amplifier, the third resistance having a smaller resistance value than the first resistance; and a fourth, selectively engageable, resistance between the voltage source and the first input of the differential amplifier, the fourth resistance having a smaller resistance value than the first resistance, the third and fourth resistances being engaged then disengaged in response to the voltage source being engaged.

25. An amplifier in accordance with claim 24 wherein the third and fourth resistances are simultaneously engaged then disengaged in response to the voltage source being engaged.

26. An amplifier in accordance with claim 24 wherein the first resistance comprises a transistor.

27. An amplifier in accordance with claim 26 wherein the second resistance comprises a transistor.

28. An amplifier in accordance with claim 24 wherein the third resistance comprises a transistor.

29. An amplifier in accordance with claim 28 wherein the fourth resistance comprises a transistor.

30. A method of speeding power up of an amplifier stage configured to be powered by a voltage source and including a differential amplifier having first and second inputs configured to receive an input signal to be amplified, and having an output, a first resistance between the voltage source and the first input of the differential amplifier, and a second resistance between the voltage source and the second input of the differential amplifier, the method comprising:

simultaneously shorting around the first and second resistances for an amount of time in response to the voltage source being engaged.

31. An amplifier configured to be powered by a selectively engageable voltage source, the amplifier comprising:

a differential amplifier having first and second inputs for receiving an input signal to be amplified, and having an output;

a first resistance between the voltage source and the first input of the differential amplifier;

a second resistance between the voltage source and the second input of the differential amplifier;

circuitry configured to switch around the third and fourth resistances for a predetermined amount of time, to cause the inputs to the differential amplifier to come up to a bias voltage more quickly, in response to the voltage source being engaged.

32. An amplifier in accordance with claim 31 wherein the circuitry configured to switch around the third and fourth resistances comprises respective transistors.

33. An amplifier in accordance with claim 32 wherein the first resistance comprises a transistor.

34. An amplifier in accordance with claim 33 wherein the second resistance comprises a transistor.

35. A method of speeding power up of an amplifier stage configured to be powered by a voltage source and including a differential amplifier having first and second inputs configured to receive an input signal to be amplified, and having an output, a first resistance between the voltage source and the first input of the differential amplifier, and a second resistance between the voltage source and the second input of the differential amplifier, the method comprising:

simultaneously switching around the first and second resistances for a predetermined amount of time in response to the voltage source being engaged.

* * * * *